(12) United States Patent
Takenaka et al.

(10) Patent No.: US 9,846,245 B2
(45) Date of Patent: Dec. 19, 2017

(54) RADIOGRAPHIC IMAGE CAPTURING APPARATUS AND RADIOGRAPHIC IMAGE CAPTURING SYSTEM

(71) Applicant: CANON KABUSHIKI KAISHA, Tokyo (JP)

(72) Inventors: Katsuro Takenaka, Honjo (JP); Toshio Kameshima, Kawasaki (JP); Tomoyuki Yagi, Chofu (JP); Atsushi Iwashita, Saitama (JP); Eriko Sato, Tokyo (JP); Hideyuki Okada, Honjo (JP); Takuya Ryu, Kokubunji (JP); Kosuke Terui, Saitama (JP); Takashi Takasaki, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/037,632

(22) PCT Filed: Oct. 30, 2014

(86) PCT No.: PCT/JP2014/078868
§ 371 (c)(1),
(2) Date: May 18, 2016

(87) PCT Pub. No.: WO2015/076080
PCT Pub. Date: May 28, 2015

(65) Prior Publication Data
US 2016/0291170 A1 Oct. 6, 2016

(30) Foreign Application Priority Data

Nov. 20, 2013 (JP) .................... 2013-240034

(51) Int. Cl.
*G01T 1/20* (2006.01)
*H04N 5/32* (2006.01)
*H01L 27/146* (2006.01)

(52) U.S. Cl.
CPC .......... *G01T 1/2006* (2013.01); *G01T 1/2018* (2013.01); *H01L 27/14603* (2013.01);
(Continued)

(58) Field of Classification Search
CPC .............................. G01T 1/2006; H04N 5/357
See application file for complete search history.

(56) References Cited

U.S. PATENT DOCUMENTS

| | | | | |
|---|---|---|---|---|
| 2007/0257196 A1* | 11/2007 | Hornig | .................. | G01T 1/2018 250/368 |
| 2014/0368710 A1* | 12/2014 | Sohn | .................... | H04N 5/3658 348/308 |
| 2015/0003584 A1* | 1/2015 | Weisfield | .............. | G01T 1/2018 378/62 |

FOREIGN PATENT DOCUMENTS

| | | |
|---|---|---|
| JP | 2001-042042 A | 2/2001 |
| JP | 2003-046075 A | 2/2003 |

(Continued)

*Primary Examiner* — David Porta
*Assistant Examiner* — Hugh H Maupin
(74) *Attorney, Agent, or Firm* — Canon U.S.A. Inc., IP Division (57) ABSTRACT

A radiographic image capturing apparatus includes: a pixel array in which a plurality of pixels outputting an electrical signal corresponding to radiation are arranged; a readout circuit section; and a member for preventing radiation from entering the readout circuit section. The pixel array includes a first region in which some pixels used for generating image signals are arranged, and a second region in which other pixels not used for generating the image signals are arranged in at least part of a region around the first region. From an outer side toward an inner side of the pixel array, an end on the inner side of the readout circuit section disposed in the second region, an end on the inner side of an orthogonal projection of the member to the pixel array, and an end on the inner side of the second region are arranged in this order.

13 Claims, 9 Drawing Sheets

(52) U.S. Cl.
CPC .. *H01L 27/14607* (2013.01); *H01L 27/14625* (2013.01); *H01L 27/14636* (2013.01); *H01L 27/14663* (2013.01); *H04N 5/32* (2013.01)

(56) References Cited

FOREIGN PATENT DOCUMENTS

| | | |
|---|---|---|
| JP | 2012-235126 A | 11/2012 |
| JP | 2013-153857 A | 8/2013 |

\* cited by examiner

RADIOGRAPHIC IMAGE CAPTURING APPARATUS AND RADIOGRAPHIC IMAGE CAPTURING SYSTEM

CROSS-REFERENCE TO RELATED APPLICATIONS

This application is a National Stage filing of International Application No. PCT/JP2014/078868 filed Oct. 30, 2014, which claims the benefit of Japanese Patent Application No. 2013-240034, filed Nov. 20, 2013, the disclosures of each of which are hereby incorporated by reference herein in their entirety.

TECHNICAL FIELD

The present invention relates to a radiographic image capturing apparatus and a radiographic image capturing system.

BACKGROUND ART

PTL 1 discloses a radiographic image capturing apparatus including a pixel array in which a plurality of pixels outputting an electrical signal corresponding to radiation are arranged, and a readout circuit section that converts electrical signals output in parallel from the pixel array into serial electrical signals and reads them. PTL 1 discloses the radiographic image capturing apparatus further including a member for preventing radiation from entering the readout circuit section.

CITATION LIST

Patent Literature
PTL 1: Japanese Patent Laid-Open No. 2001-042042

SUMMARY OF INVENTION

Technical Problem

In PTL 1, however, the layout relationship between the member for preventing radiation from entering and the pixel array has not been studied sufficiently, and an apparatus layout for obtaining more satisfactory image signals has to be studied further.

Solution to Problem

The present invention provides a radiographic image capturing apparatus constructed on the basis of an apparatus layout for obtaining more satisfactory image signals. A radiographic image capturing apparatus of the present invention includes: a pixel array in which a plurality of pixels outputting an electrical signal corresponding to radiation are arranged; a readout circuit section that reads an electrical signal output from the pixel array; and a member for preventing radiation from entering the readout circuit section, and the radiographic image capturing apparatus causes image signals to be generated based on electrical signals read by the readout circuit section. The pixel array includes a first region in which, among the plurality of pixels, some pixels used for generating the image signals are arranged, and a second region in which, among the plurality of pixels, other pixels not used for generating the image signals and different from the some pixels are arranged in at least part of a region around the first region. The readout circuit section is disposed in the second region. From an outer side toward an inner side of the pixel array in at least one direction of the pixel array, an end on the inner side of the readout circuit section, an end on the inner side of an orthogonal projection of the member to the pixel array, and an end on the inner side of the second region are arranged in this order.

Advantageous Effects of Invention

The present invention can provide a radiographic image capturing apparatus constructed on the basis of an apparatus layout for obtaining more satisfactory image signals.

DESCRIPTION OF EMBODIMENTS

Figure 1:
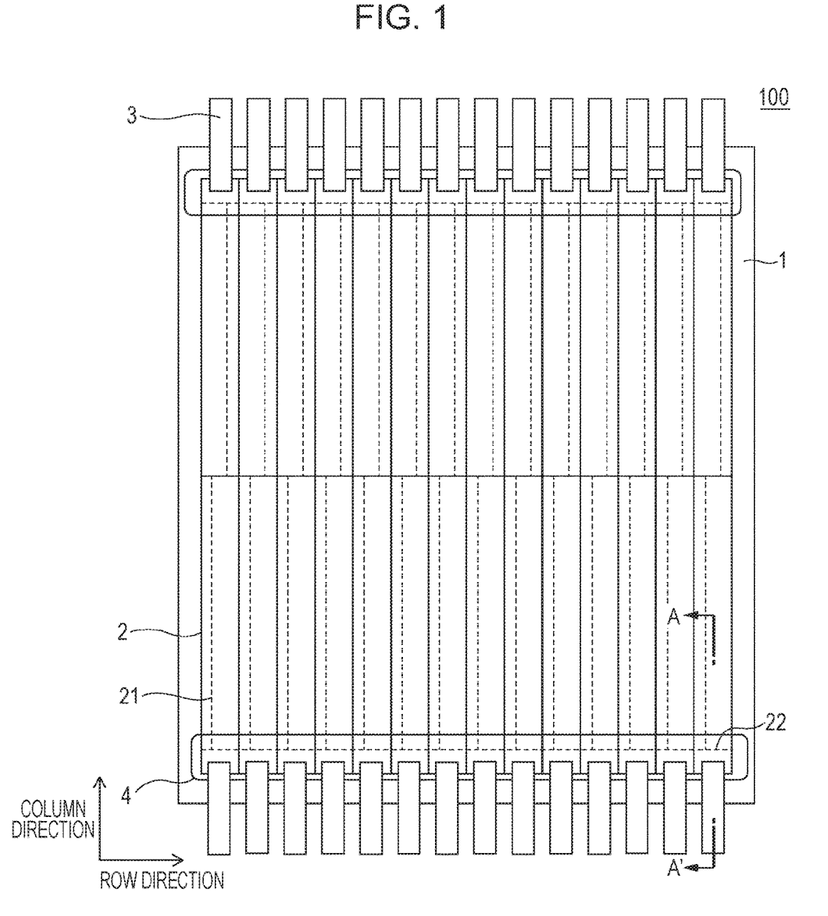
FIG. 1 is a plan schematic diagram illustrating a schematic structure of a radiographic image capturing apparatus according to a first embodiment.
Figure 2:
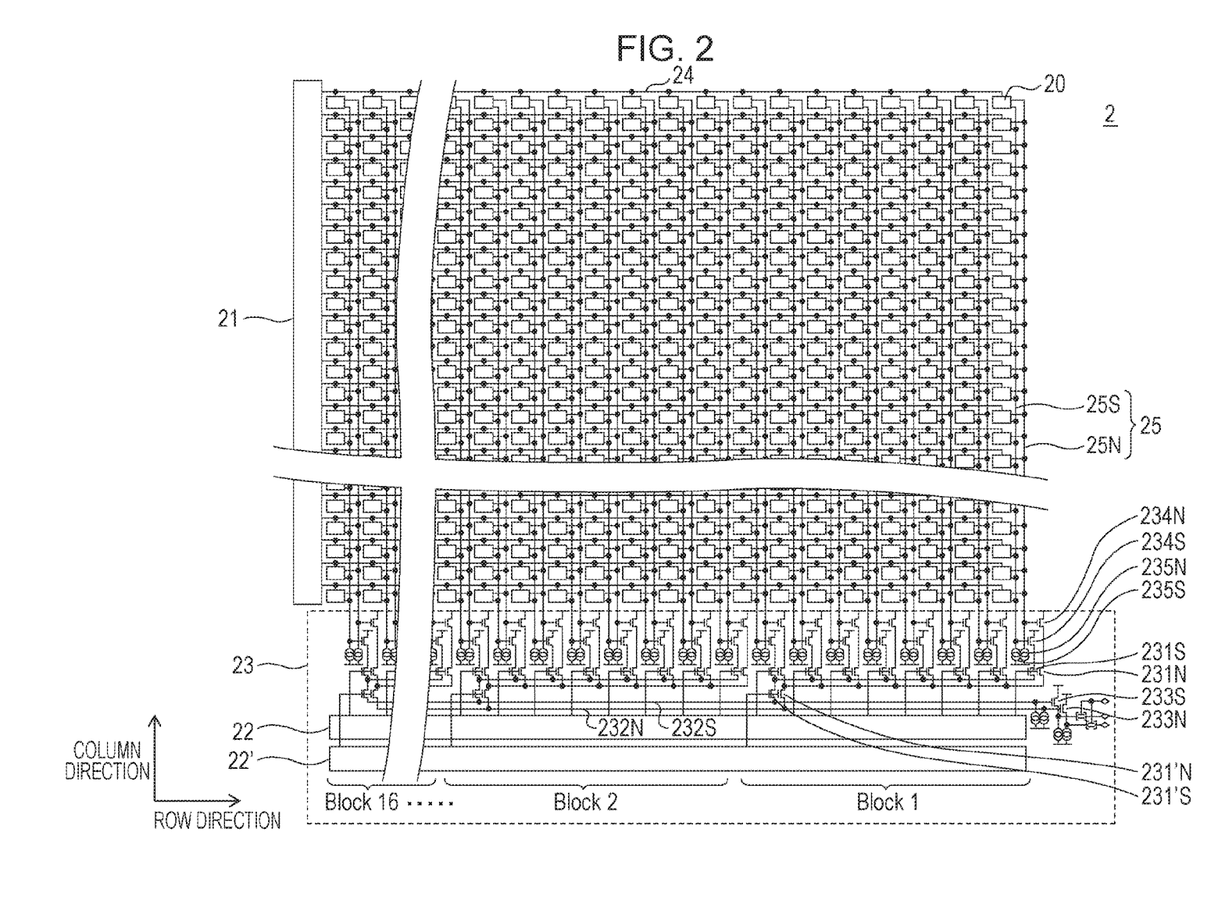
FIG. 2 is a schematic equivalent circuit diagram of the radiographic image capturing apparatus according to the first embodiment.

Embodiments will be described in detail below with reference to the drawings.
(First Embodiment)
A radiographic image capturing apparatus according to a first embodiment will be described with reference to FIGS. 1 to 3. FIG. 1 is a plan schematic diagram illustrating a schematic structure of the radiographic image capturing apparatus according to the first embodiment. FIG. 2 is a schematic equivalent circuit diagram of the radiographic image capturing apparatus according to the first embodiment. There is a schematic diagram illustrating a schematic layout of a pixel array of the radiographic image capturing apparatus according to the first embodiment.

Figure 3:
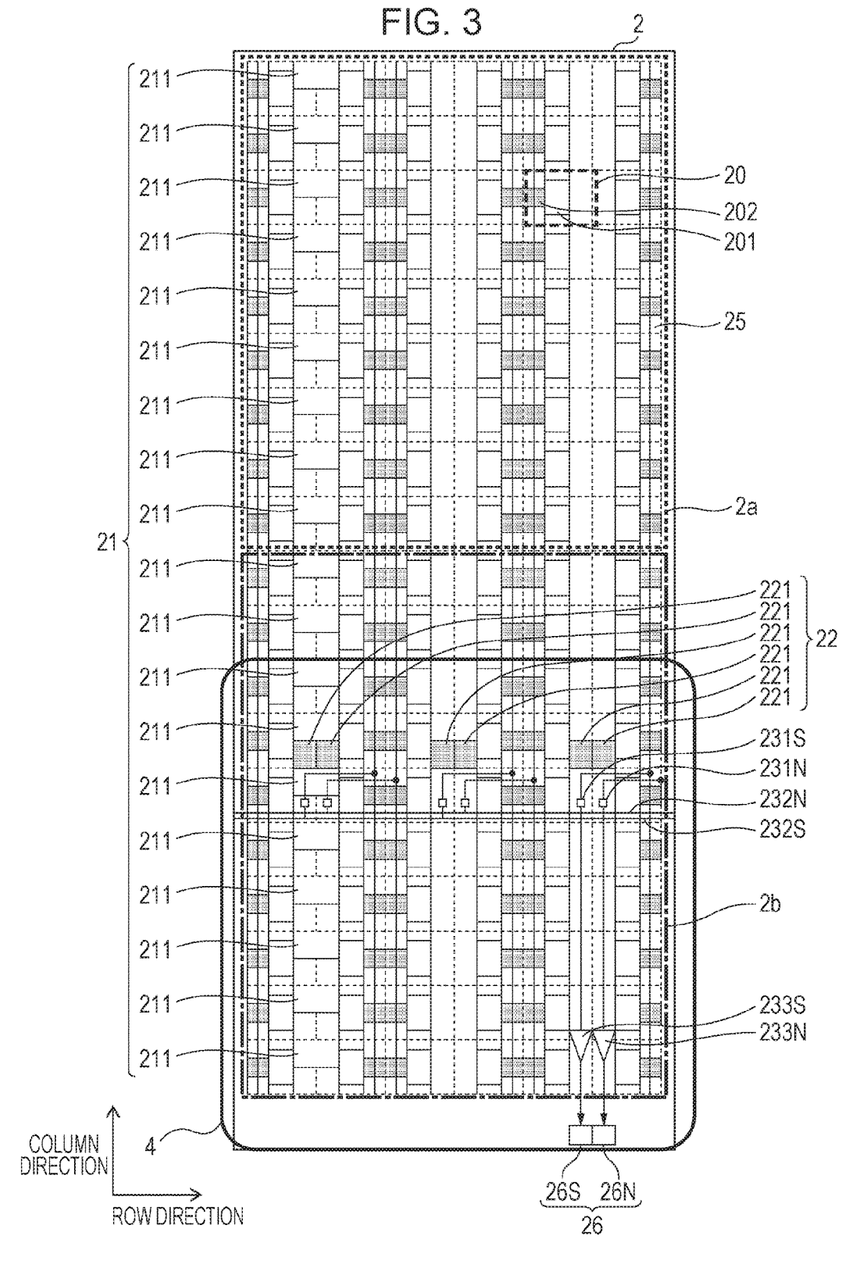
FIG. 3 is a schematic diagram illustrating a schematic layout of a pixel array of the radiographic image capturing apparatus according to the first embodiment.

As illustrated in FIGS. 1 to 3, a radiographic image capturing apparatus 100 includes a pixel array 2, a readout circuit section 23, and a member 4. The radiographic image capturing apparatus 100 can also include a drive circuit section 21, a flexible wiring board 3, and a scintillator (not illustrated).

In the pixel array 2, a plurality of pixels 20 outputting an electrical signal corresponding to radiation are arranged, and the plurality of pixels 20 are desirably arranged in a matrix.

As illustrated in FIG. 3, the plurality of pixels 20 can each include a photoelectric conversion element 201 and an output circuit section 202. The photoelectric conversion element 201 is an element that converts light converted by the scintillator that converts radiation into light into electric charge. In this embodiment, as a photoelectric conversion element, a photodiode provided on a semiconductor substrate, such as a silicon substrate, is used. Note that the present invention is not limited to this. For example, there may be used an amorphous silicon photoelectric conversion element disposed on an insulating substrate, such as a glass substrate, or a conversion element that directly converts radiation into electric charge without using a scintillator. The output circuit section 202 is a circuit section that outputs an electrical signal obtained by amplifying the electric charge of the photoelectric conversion element 201, and an example of the detailed structure thereof will be described later. In this embodiment, the pixel array 2 is disposed across a plurality of semiconductor substrates arranged on a base 1.

The drive circuit section 21 represented by a dotted line in FIG. 1 is a circuit that supplies each drive signal via a drive line section 24 and thereby causes the pixel array 2 to operate in units of intended pixel groups. In this embodiment, the drive circuit section 21 is the circuit that also causes output circuit sections 20 of the plurality of pixels 20 of the pixel array 2 to operate in units of rows. The drive circuit section 21 includes a plurality of unit circuit sections 211 as illustrated in FIG. 3, and each unit circuit section 211 controls operation of the pixels 20 of each row. A shift register is suitably used for the drive circuit section 21, and a unit circuit of the shift register can be used for each unit circuit section 211. The drive line section 24 is a group of drive lines prepared individually for each drive signal, and the drive line section 21 is provided for each row of the pixel array 2 in this embodiment. In this embodiment, the drive circuit section 21 is disposed across a plurality of semiconductor substrates arranged on the base 1, and is provided for each group of a plurality of semiconductor substrates.

The readout circuit section 23 is a circuit section that converts electrical signals output in parallel from the pixel array 2 via signal lines 25S and signal lines 25N into serial electrical signals and reads them. The readout circuit section 23 includes a selection switch 231S, a selection switch 231N, a selection switch 231'S, a selection switch 231'N, a scanning circuit 22, a scanning circuit 22', an output line 232S, an output line 232N, an output buffer 233S, and an output buffer 233N. S denotes a system for an electrical signal based on electric charge generated in a pixel in response to radiation, and N denotes a system for an electrical signal based on an offset of a pixel. The selection switch 231S and the selection switch 231N are provided for each column of the pixel array 2, and are elements that select an intended pixel column of the pixel array 2. As in this embodiment, the pixel array 2 may be divided into a plurality of blocks, and thus the selection switch 231'S and the selection switch 231'N that select a block may be provided for each block. The scanning circuit 22 represented by a dashed line in FIG. 1 is a circuit that selects selection switches 231S and 231N as appropriate to convert electrical signals output in parallel from the pixel array 2 into serial electrical signals. The scanning circuit 22 includes a plurality of unit circuit sections 221 as illustrated in FIG. 3, and each unit circuit section 221 controls selection of the pixels 20 of each column. A shift register is suitably used for the scanning circuit section 22, and a unit circuit of the shift register can be used for each unit circuit section 221. As in this embodiment, the pixel array 2 may be divided into a plurality of blocks, and thus there may be provided the scanning circuit 22' that selects, as appropriate for each block, the selection switches 231'S and 231'N that select a block. The output line 232S and the output buffer 233S, and the output line 232N and the output buffer 233N function as an output section that outputs serial electrical signals. The output lines 232S and 232N transmit serial electrical signals, and the output buffers 233S and 233N buffer and output the transmitted serial electrical signals. In this embodiment, the readout circuit section 23 is disposed across a plurality of semiconductor substrates arranged on the base 1, and is provided for each group of a plurality of semiconductor substrates. In addition, the readout circuit section 23 may further include column buffer MOSs 234S and 234N and current sources 235S and 235N that are electrically connected to the signal lines.

The flexible wiring board 3 is electrically connected to an output terminal 26S and an output terminal 27S that are electrically connected to the output section, and is a circuit board that transmits electrical signals output from the readout circuit section 23 to a signal processing section (not illustrated). In this embodiment, the flexible wiring board 3 is provided for each group of a plurality of semiconductor substrates arranged on the base 1.

The member 4 is a member for preventing radiation from entering the readout circuit section 23. A heavy metal material, such as lead or tungsten, having high radiation absorption and/or shielding properties can be suitably used for the member 4. The thickness of the member 4 is suitably set in accordance with the required degree of radiation absorption and/or shielding, and a lead plate with a thickness of 1 mm is used in this embodiment. When radiation enters the readout circuit section 23, which is a semiconductor integrated circuit, noise can be caused by electric charge corresponding to the incident radiation. In particular, in the case of the structure in which the readout circuit section 23 is disposed on semiconductor substrates, a problem of noise that can be caused in the readout circuit section 23 by electric charge generated in the semiconductor substrates becomes more pronounced. For this reason, it is desirable to use the member 4 that prevents radiation from entering the readout circuit section 23. Note that, when the member 4 is disposed, a reduced amount of radiation is likely to enter pixels 20 arranged in the vicinity of the readout circuit section 23 among the plurality of pixels 20 of the pixel array 2 in comparison with pixels 20 located in the center of the plurality of pixels 20. This results in a difference in obtained image signals, and causes image artifacts, and the quality of the obtained image is likely to be degraded. Furthermore, in some cases, it is difficult to leave a margin for the layout of the member 4.

Figure 4:
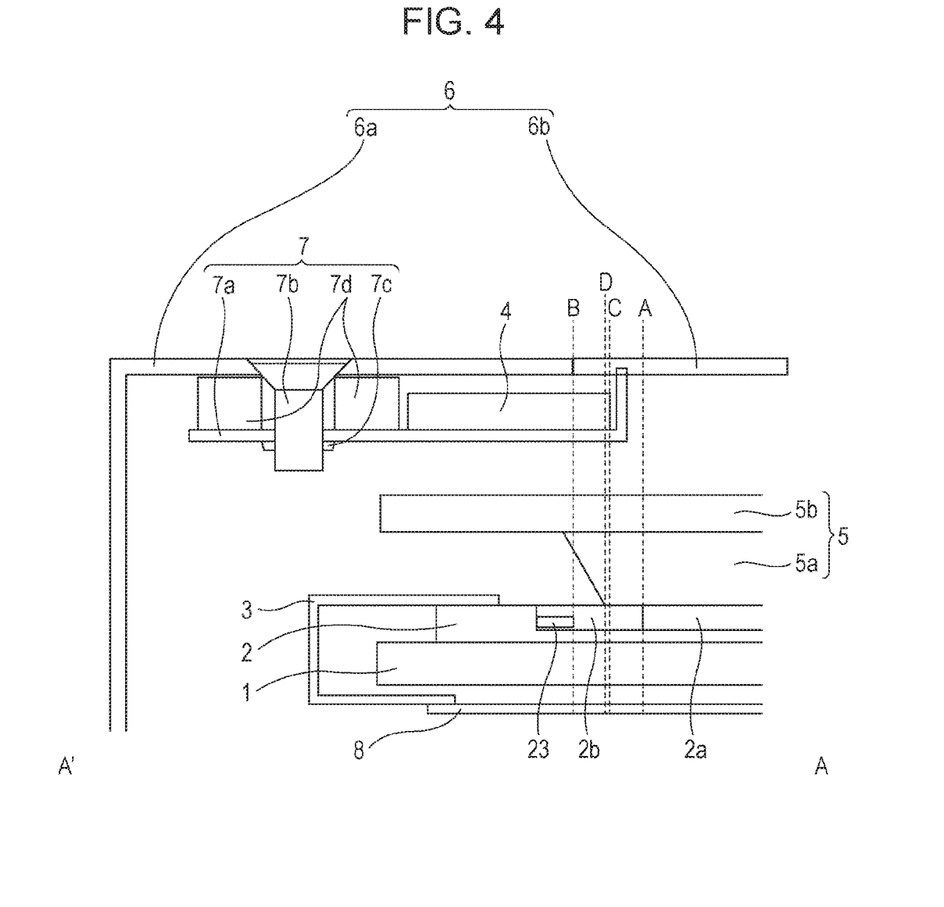
FIG. 4 is a cross-sectional schematic diagram illustrating a schematic structure of the radiographic image capturing apparatus according to the first embodiment.

Thus, as a result of diligent study, the following layout is provided in the present invention. The layout providing suitable location specifications of the member 4 of the present invention will be described with reference to FIGS. 3 and 4. FIG. 4 is a cross-sectional schematic diagram illustrating a schematic structure of the radiographic image capturing apparatus 100 taken along a line A-A' in FIG. 1.

As illustrated in FIG. 3, the pixel array 2 includes a first region 2a and a second region 2b. The first region 2a is a region in which, among the plurality of pixels 20, some pixels used for generating image signals are arranged. The second region 2b is a region in which, among the plurality of pixels 20, other pixels 20 not used for generating image signals and different from the some pixels are arranged in at least part of a region around the first region 2a. In the following description, the some pixels are referred to as effective pixels, the other pixels are referred to as dummy pixels, the first region 2a is referred to as an effective pixel region, and the second region 2b is referred to as a dummy pixel region. The readout circuit section 23 is disposed in the dummy pixel region 2b. Then, from the outer side toward the inner side of the pixel array 2 in at least one direction of the pixel array 2, an inner end B of the readout circuit section 22, an inner end C of an orthogonal projection of the member 4 to the pixel array 2, and an inner end A of the dummy pixel region 2b are arranged in this order. In this embodiment, the at least one direction of the pixel array 2 herein is a column direction.

First, the inner end B of the readout circuit section 23 is located on the outer side with respect to the inner end A of the dummy pixel region 2b, and thus dummy pixels outputting electrical signals not used for generating image signals are present between the readout circuit section 23 and the effective pixel region 2a at all times. Then, the inner end C of the orthogonal projection of the member 4 to the pixel array 2 is located between the inner end A of the dummy pixel region 2b and the inner end B of the readout circuit section 23. Thus, pixels in which a reduced amount of radiation is likely to enter because of the member 4 are regarded as dummy pixels, and are not used for generating image signals. As a result, electrical signals output from pixels generating electrical signals that can result in artifacts are not used for generating image signals, thereby preventing the occurrence of image artifacts. Furthermore, as a layout margin of the member 4, a margin of the size of a dummy pixel present between the inner end A of the dummy pixel region 2b and the inner end B of the readout circuit section 23 can be left. When a plurality of dummy pixels are present between the inner end A of the dummy pixel region 2b and the inner end B of the readout circuit section 23, a larger margin can be left. In this embodiment, in the dummy pixel region, ten dummy pixels are arranged from the outer side (the lower side of FIG. 3) toward the inner side of the pixel array 2, and the readout circuit section 23 is disposed in a region including seven pixels from the outer side of the pixel array 2. For this reason, three dummy pixels are arranged between the inner end A of the dummy pixel region 2b and the inner end B of the readout circuit section 23, and thus, as the layout margin of the member 4, a margin of three pixels can be left. In this embodiment, the inner end C of the orthogonal projection of the member 4 to the pixel array 2 is located between the eighth dummy pixel and the ninth dummy pixel from the outer side of the pixel array 2 so that the member 4 covers eight dummy pixels from the outer side of the pixel array 2 and the readout circuit section 23. Note that the numbers of pixels described above are an example, and the present invention is not limited to these.

Here, as illustrated in FIG. 3, in the dummy pixel region, each unit circuit section 221 of the scanning circuit 22 is disposed between the photoelectric conversion elements 201 of two adjacent pixels 20. Then, the unit circuit section 221 of the scanning circuit 22 is disposed so that the photoelectric conversion element 201 of one pixel 20 of the two adjacent pixels 20 is interposed between the unit circuit section 221 and the output circuit section 202 of the one pixel 20. Furthermore, in the dummy pixel region, the output buffer 233S and the output buffer 233N constituting the output section are disposed between the photoelectric conversion elements 201 of two adjacent pixels 20. Then, the output buffer 233S and the output buffer 233N are disposed so that the photoelectric conversion element 201 of one pixel 20 of the two adjacent pixels 20 is interposed between the output buffers 233S and 233N and the output circuit section 202 of the one pixel 20. This arrangement enables the readout circuit section 23 to be suitably disposed in the dummy pixel region with the arrangement pitch of the photoelectric conversion elements 20 being kept. The plurality of unit circuit sections 211 of the drive circuit section 21 are arranged across the effective pixel region 2a and the dummy pixel region 2b. Furthermore, each unit circuit section 211 is disposed between the photoelectric conversion elements 201 of two adjacent pixels 20 so that the photoelectric conversion element 201 of one pixel 20 of the two adjacent pixels 20 is interposed between the unit circuit section 211 and the output circuit section 202 of the one pixel 20.

In this embodiment, image signals can be generated by the signal processing section (not illustrated) provided on a printed circuit board 8 electrically connected to the flexible wiring board 3.

A scintillator 5 converts radiation into light that can be sensed by each photoelectric conversion element, and includes a scintillator layer 5a and a support member 5b. The scintillator layer 5a is a layer that converts radiation into light that can be sensed by each photoelectric conversion element, and can be formed of, for example, an alkali halide scintillator. The scintillator layer 120 may be formed of an aggregate of columnar crystals obtained by evaporating alkali halides, such as CsI:Na and CsI:Tl, onto a sensor protection layer 113 of a sensor panel 110. Radiation in the present invention are, for example, X-rays, α-rays, β-rays, or γ-rays, and X-rays are used in this embodiment. The support member 5b is a member that supports the scintillator layer, and can be composed of a material having lower radiation absorption and/or shielding properties than those of the member 4. Aluminum (Al), which is a light metal material, or a carbon resin substrate, such as a carbon-fiber-reinforced plastic (CFRP), can be suitably used for the support member 5b. Furthermore, in the case where an alkali halide scintillator layer is used and where a conductive material is used for the support member 5b, it is desirable to use the support member 5b whose surface has been insulated to prevent electrochemical corrosion of the scintillator layer. In the structure in which the inner end B of the readout circuit section 22 is located on the outer side with respect to an outer end D of an orthogonal projection of a surface of the scintillator layer 5a facing the pixels 20 to the pixel array 2, radiation cannot be sufficiently absorbed by the scintillator layer 5a. Thus, in such a structure, effects due to the member 4 preventing radiation from entering become more pronounced.

In this embodiment, as illustrated in FIG. 4, the radiographic image capturing apparatus 100 includes a housing 6 that houses the base 1, a plurality of semiconductor substrates, and the member 4. In this embodiment, the housing 6 includes a box member 6a and a lid member 6b. The lid member 6 can be composed of a material having lower radiation absorption and/or shielding properties than those of the member 4, and a CFRP can be suitably used. The lid member 6b can be disposed according to the pixel array 2. The box member 6a mechanically supports the lid member 6b. The housing 6 prevents light from the outside of the housing 6 from entering the pixel array 2. In this embodiment, the radiographic image capturing apparatus 100 further includes a support mechanism 7 that is coupled to the housing 6 and mechanically supports the member 4. In the support mechanism 7, a support plate 7a is coupled to the housing 6 with a screw 7b and a nut 7c, and a location in which the member 4 is disposed is defined by a spacer 7c. Note that the support mechanism of the present invention is not limited to this structure, and any mechanism that is coupled to the housing 6 and can mechanically support the member 4 may be used.

Figure 5:
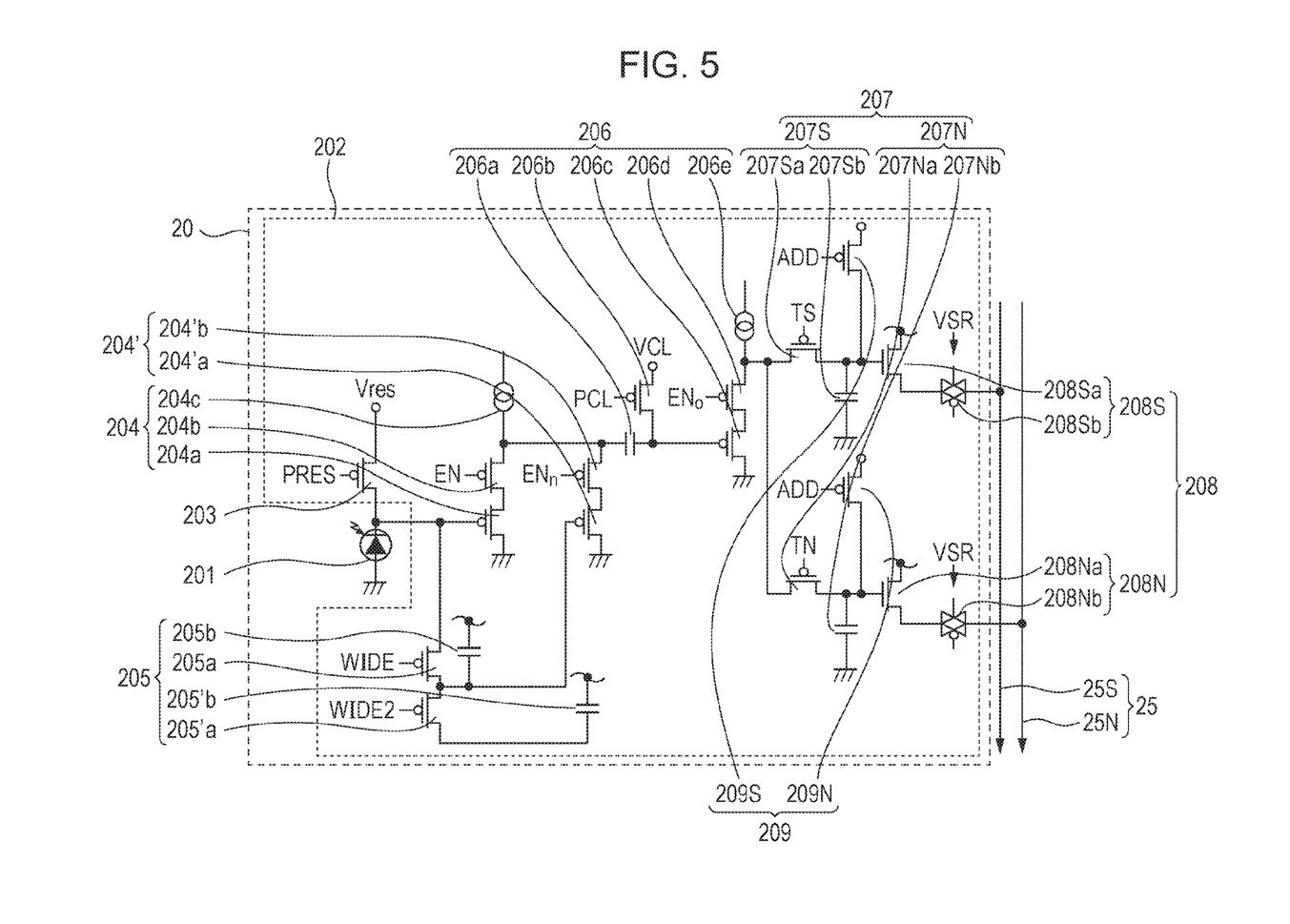
FIG. 5 is a schematic equivalent circuit diagram of one pixel illustrating an example of the one pixel of the radiographic image capturing apparatus.

Next, an example of the structure of each pixel 20 will be described with reference to FIG. 5. FIG. 5 is a schematic equivalent circuit diagram of one pixel illustrating an example of the one pixel of the radiographic image capturing apparatus. As described above, the pixel 20 includes the photoelectric conversion element 201 and the output circuit section 202. The photoelectric conversion element 202 can be typically a photodiode. The output circuit section 202 includes an amplifier circuit section 204, a clamp circuit section 206, a sample-and-hold circuit section 207, and a selection circuit section 208.

The photoelectric conversion element 202 includes a charge accumulation section, and the charge accumulation section is connected to a gate of a MOS transistor 204a of the amplifier circuit section 204. A source of the MOS transistor 204a is connected to a current source 204c via a MOS transistor 204b. The MOS transistor 204a and the current source 204c constitute a source follower circuit. The MOS transistor 20b is an enable switch that is turned ON when an enable signal EN supplied to the gate thereof switches to an active level and that puts the source follower circuit into an operation state.

In the example illustrated in FIG. 5, the charge accumulation section of the photoelectric conversion element 201 and the gate of the MOS transistor 204a constitute a common node, and this node functions as a charge-to-voltage conversion section that converts electric charge accumulated in the charge accumulation section into a voltage. That is, in the charge-to-voltage conversion section, a voltage V (=Q/C) determined by electric charge Q accumulated in the charge accumulation section and a capacitance value C of the charge-to-voltage conversion section appears. The charge-to-voltage conversion section is connected to a reset potential Vres via a reset switch 203. The reset switch 203 is turned ON when a reset signal PRES switches to an active level, and a potential of the charge-to-voltage conversion section is reset to the reset potential Vres.

The clamp circuit section 206 clamps, by using a clamp capacitor 206a, noise output by the amplifier circuit section 204 in response to the reset potential of the charge-to-voltage conversion section. That is, the clamp circuit section 206 is a circuit for cancelling this noise from a signal output from the source follower circuit in response to electric charge generated by photoelectric conversion in the photoelectric conversion element 201. This noise contains kTC noise at the time of reset. Clamping is performed by switching a clamp signal PCL to an active level to put a MOS transistor 206b into an ON state, and then by switching the clamp signal PCL to an inactive level to put the MOS transistor 206b into an OFF state. The output side of the clamp capacitor 206a is connected to a gate of a MOS transistor 206c. A source of the MOS transistor 206c is connected to a current source 206e via a MOS transistor 206d. The MOS transistor 206c and the current source 206e constitute a source follower circuit. The MOS transistor 206d is an enable switch that is turned ON when an enable signal EN0 supplied to the gate thereof switches to an active level and that puts the source follower circuit into an operation state.

A signal output from the clamp circuit section 206 in response to electric charge generated by photoelectric conversion in the photoelectric conversion element 201 is written into a capacitor 207Sb as a light signal via a switch 207Sa when a light signal sampling signal TS switches to an active level. A signal output from the clamp circuit section 206 when the MOS transistor 206b is put into an ON state immediately after the potential of the charge-to-voltage conversion section is reset is noise. This noise is written into a capacitor 207Nb via a switch 207Na when a noise sampling signal TN switches to an active level. This noise contains an offset component of the clamp circuit section 206. The switch 207Sa and the capacitor 207Sb constitute a signal sample-and-hold circuit 207S, and the switch 207Na and the capacitor 207Nb constitute a noise sample-and-hold circuit 207N. The sample-and-hold circuit section 207 includes the signal sample-and-hold circuit 207S and the noise sample-and-hold circuit 207N.

When the unit circuit section 211 of the drive circuit section 21 drives a row selection signal VST to an active level, a signal (light signal) held in the capacitor 207Sb is output to the signal line 25S via a MOS transistor 208Sa and a row selection switch 208Sb. At the same time, a signal (noise) held in the capacitor 207Nb is output to the signal line 25N via a MOS transistor 208Na and a row selection switch 208Nb. The MOS transistor 208Sa and the constant current source 235S (illustrated in FIG. 2) provided in the signal line 25S constitute a source follower circuit. Similarly, the MOS transistor 208Na and the constant current source 235N (illustrated in FIG. 2) provided in the signal line 25N constitute a source follower circuit. The MOS transistor 208Sa and the row selection switch 208Sb constitute a signal selection circuit section 208S, and the MOS transistor 208Na and the row selection switch 208Nb constitute a noise selection circuit section 208N. The selection circuit section 208 includes the signal selection circuit section 208S and the noise selection circuit section 208N.

The pixel 20 may include an addition switch 209S that adds light signals of a plurality of adjacent pixels 20. In an addition mode, an addition mode signal ADD switches to an active level, and the addition switch 209S is put into an ON state. Thus, the capacitors 207Sb of the adjacent pixels 20 are connected to each other by the addition switch 209S, and light signals are averaged. Similarly, the pixel 20 may include an addition switch 209N that adds noise signals of a plurality of adjacent pixels 20. When the addition switch 209N is put into an ON state, the capacitors 207Nb of the adjacent pixels 20 are connected to each other by the addition switch 209N, and noise signals are averaged. An addition section 209 includes the addition switch 209S and the addition switch 209N.

The pixel 20 may include a sensitivity change section 205 for changing sensitivity. The pixel 20 can include, for example, a first sensitivity change switch 205a, a second sensitivity change switch 205′a, and circuit elements associated with them. When a first change signal WIDE switches to an active level, the first sensitivity change switch 205a is turned ON, and a capacitance value of a first additional capacitor 205b is added to a capacitance value of the charge-to-voltage conversion section. This lowers the sensitivity of the pixel 20. When a second change signal WIDE2 switches to an active level, the second sensitivity change switch 205′a is turned ON, and a capacitance value of a second additional capacitor 205′b is added to a capacitance value of the charge-to-voltage conversion section. This further lowers the sensitivity of the pixel 201. In this way, addition of a function of lowering the sensitivity of the pixel 20 enables a larger amount of light to be received, and thus a dynamic range can be widened. In the case where the first change signal WIDE switches to the active level, an enable signal ENw may be switched to an active level to cause a MOS transistor 204'*a* to perform a source follower operation in addition to the MOS transistor 204*a*.

Figure 6:
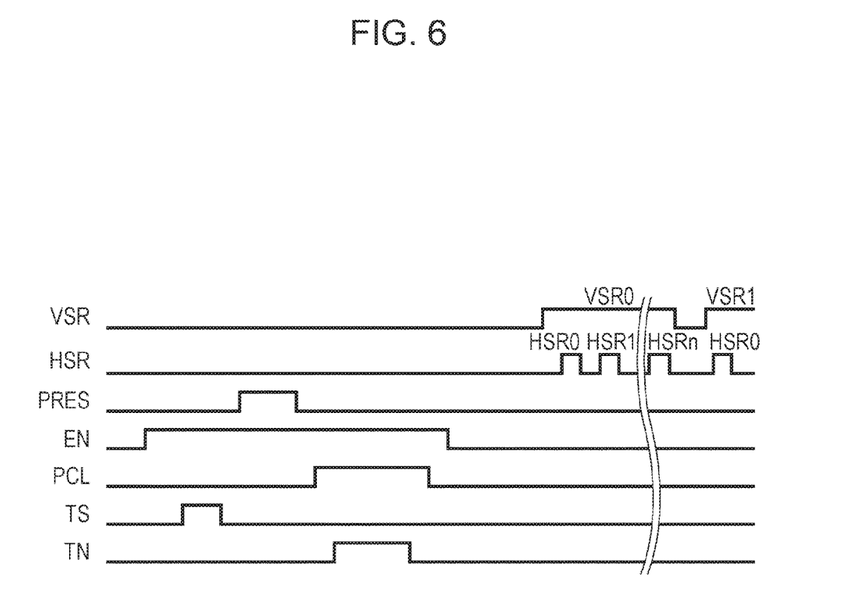
FIG. 6 is a schematic timing chart illustrating an example of the operation of the radiographic image capturing apparatus.

Next, main signals necessary for the operation of the radiographic image capturing apparatus will be described with reference to FIG. 6. FIG. 6 is a schematic timing chart illustrating an example of the operation of the radiographic image capturing apparatus. The reset signal PRES, the enable signal EN, the clamp signal PCL, the light signal sampling signal TS, and the noise sampling signal TN are low active signals. Although not illustrated in FIG. 6, the enable signal EN0 can be a signal similar to the enable signal EN. Although not illustrated in 6, in the case where the first change signal WIDE becomes active, the enable signal ENw can make a transition in the same manner as the enable signal EN.

First, the enable signal EN becomes active for all rows in the pixel array 2, the light signal sampling signal TS switches to the active level in a pulsed pattern, and a light signal is written into the capacitor 207Sb.

Subsequently, the reset signal PRES switches to the active level in a pulsed pattern, and the potential of the charge-to-voltage conversion section is reset. Then, the clamp signal PCL switches to the active level in a pulsed pattern. When the clamp signal PCL is at the active level, the noise sampling signal TN switches to the active level in a pulsed pattern, and noise is written into the capacitor 207Nb.

Subsequently, the unit circuit section 211 corresponding to the first row of the drive circuit section 21 switches its row selection signal VST (VST0) to the active level. This refers to the fact that the drive circuit section 21 selects the first row of the pixel array 2. Under this condition, the unit circuit sections 221 corresponding to the first to last columns of the scanning circuit 22 switch their column selection signals HST (HST0 to HST*n*) to an active level. This refers to the fact that the scanning circuit 22 sequentially selects the first to last columns of the pixel array 2. Thus, light signals and noise signals of pixels in the first to last columns in the first row of the pixel array 2 are output from the output buffers 233S and 233N. Subsequently, the unit circuit section 211 corresponding to the second row of the drive circuit section 21 switches its row selection signal VST (VST1) to the active level. Under this condition, the unit circuit sections 221 corresponding to the first to last columns of the scanning circuit 22 switch their column selection signals HST (HST0 to HST*n*) to the active level. Such an operation is performed on up to the last row, and electrical signals output in parallel from the pixel array 2 are thereby converted into serial electrical signals, and are read by the readout circuit section 23.

(Second Embodiment)

Figure 7:
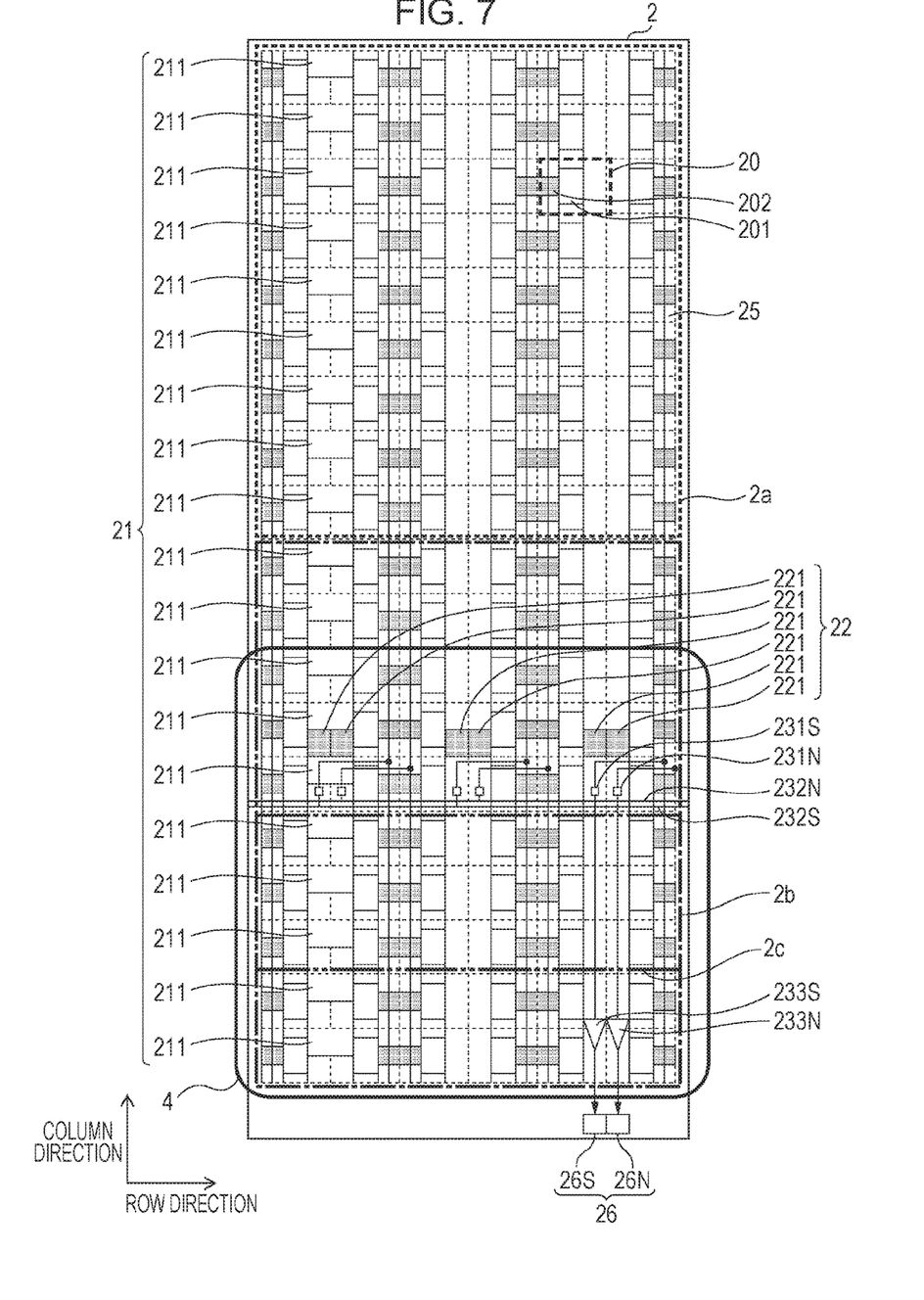
FIG. 7 is a schematic diagram illustrating a schematic layout of the pixel array of the radiographic image capturing apparatus according to a second embodiment.
Figure 8:
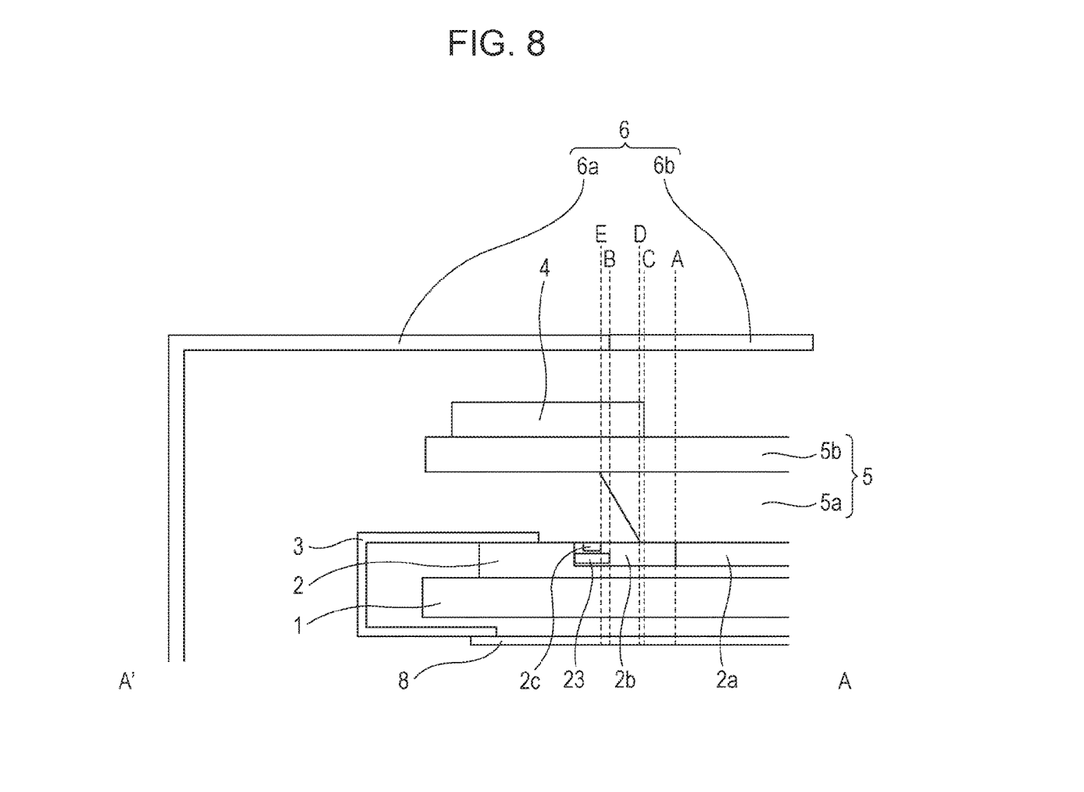
FIG. 8 is a cross-sectional schematic diagram illustrating a schematic structure of the radiographic image capturing apparatus according to the second embodiment.

Next, the layout of the radiographic image capturing apparatus according to a second embodiment will be described with reference to FIGS. 7 and 8. FIG. 7 is a schematic diagram illustrating a schematic layout of the pixel array of the radiographic image capturing apparatus according to the second embodiment. FIG. 8 is a cross-sectional schematic diagram illustrating a schematic structure of the radiographic image capturing apparatus according to the second embodiment. Note that components that are the same as those in the first embodiment illustrated in FIGS. 3 and 4 are given the same reference numerals, and detailed description thereof is omitted.

The pixel array 2 in the second embodiment further includes, in the dummy pixel region 2*b*, a third region (hereinafter referred to as a light shielding pixel region) 2*c* in which pixels (hereinafter referred to as light shielding pixels) whose photoelectric conversion elements 201 are shielded from light are arranged to output electrical signals used for correcting image signals. An image signal can be corrected by the signal processing section (not illustrated) provided on the printed circuit board 8 electrically connected to the flexible wiring board 3. Then, the light shielding pixel region 2*c* is provided so that an inner end E of the light shielding pixel region 2*c* is located on the outer side with respect to the inner end B of the readout circuit section 23. Such a structure enables the member 4 to prevent radiation from entering the light shielding pixels with certainty, and can improve accuracy with which an image signal is corrected.

Furthermore, the member 4 in the second embodiment is fastened to the support member 5*b* disposed to face the photoelectric conversion elements 201 with the scintillator layer 5 interposed between the support member 5*b* and the photoelectric conversion elements 201. Such a structure enables omission of the support mechanism 7 in the first embodiment, and can make the thickness of the radiographic image capturing apparatus 100 thinner than that in the first embodiment.

(Application)

Figure 9:
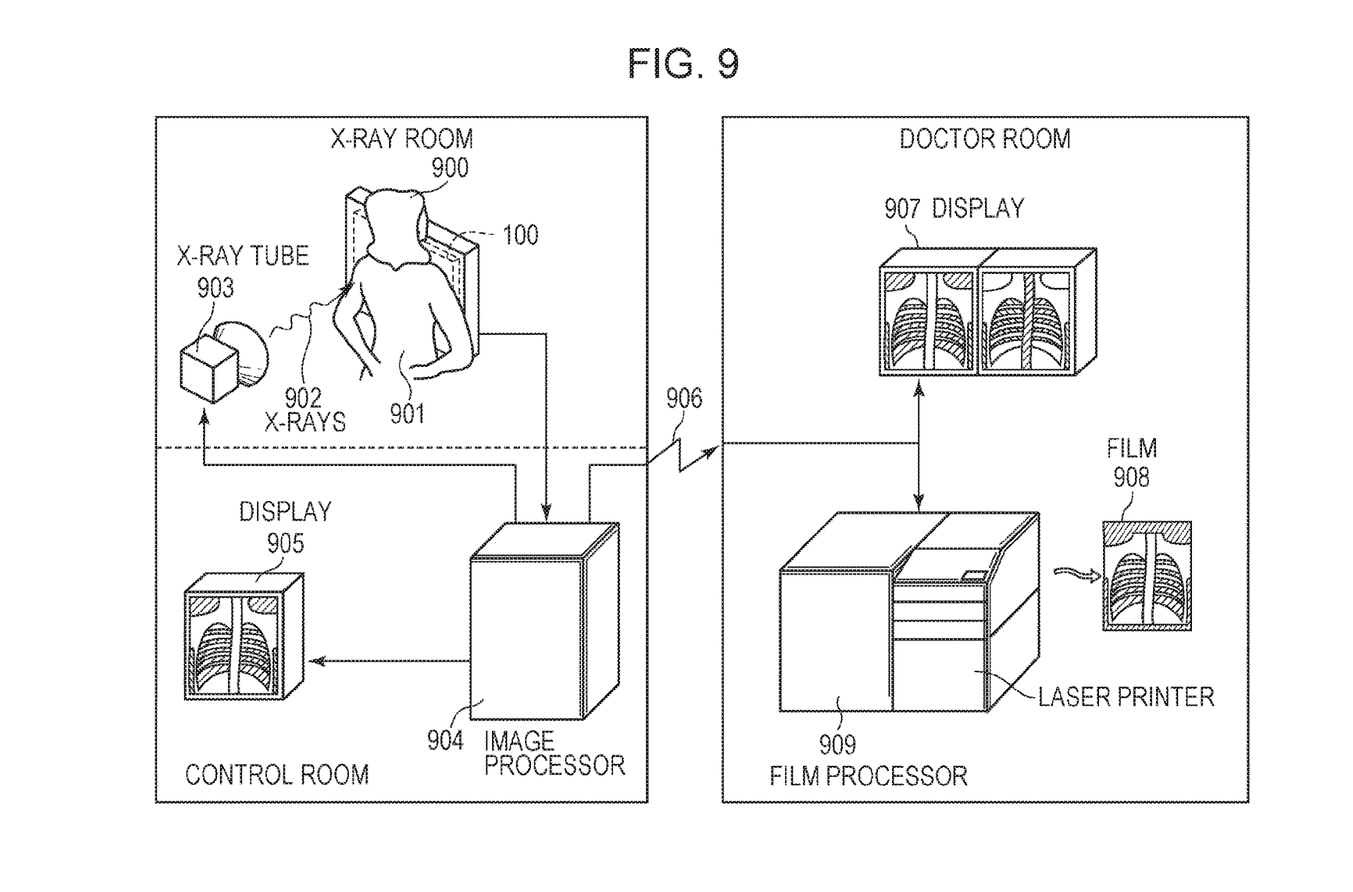
FIG. 9 is a schematic diagram illustrating an application to a radiographic image capturing system using the radiographic image capturing apparatus.

Next, with reference to FIG. 9, an application of the radiographic image capturing apparatus 100 to a radiographic image capturing system is illustrated. X-rays (radiation) 902 generated by an X-ray tube (radiation source) 903 pass through a chest 901 of a test subject or patient 900, and enters the radiographic image capturing apparatus 100. The incident X-rays contain information about the inside of the body of the patient 900. The scintillator layer emits light in response to the incident X-rays, this is subjected to photoelectric conversion, and thus electrical information is obtained. This information is converted into digital signals, and the digital signals are subjected to image processing by an image processor (signal processing apparatus) 904, and can be viewed on a display (display unit) 905 in a control room. Note that the radiographic image capturing system includes at least the radiographic image capturing apparatus 100 and the signal processing apparatus 904 that processes electrical signals from the radiographic image capturing apparatus 100. Furthermore, in such a radiographic image capturing system, an image signal may be generated or corrected in the signal processing apparatus 904 in place of the signal processing section (not illustrated) on the printed circuit board 8 used in FIGS. 4 and 8.

Additionally, this information can be transferred to a remote place by using a transmission processing unit 906, such as a telephone line, and can be displayed on a display (display apparatus) 207 in a doctor room or the like in another place, or can be stored in a recording apparatus, such as an optical disk, thus enabling a doctor in the remote place to make a diagnosis. This information can also be recorded on a film 908, which is a recording medium, by a film processor 909, which is a recording apparatus.

The present invention is not limited to the above-described embodiments, and various changes and modifications can be made without departing from the spirit and scope of the present invention. Accordingly, in order to publicize the scope of the present invention, the following claims are appended.

The invention claimed is:

1. A radiographic image capturing apparatus comprising:
   a pixel array in which a plurality of pixels outputting an electrical signal corresponding to radiation are arranged;
   a readout circuit section that reads an electrical signal output from the pixel array; and a member for preventing radiation from entering the readout circuit section, the radiographic image capturing apparatus causing image signals to be generated based on electrical signals read by the readout circuit section, wherein the pixel array includes a first region in which, among the plurality of pixels, some pixels used for generating the image signals are arranged, and a second region in which, among the plurality of pixels, other pixels not used for generating the image signals and different from the some pixels are arranged in at least part of a region around the first region, wherein the readout circuit section is disposed in the second region, and wherein, from an outer side toward an inner side of the pixel array in at least one direction of the pixel array, an end on the inner side of the readout circuit section, an end on the inner side of an orthogonal projection of the member to the pixel array, and an end on the inner side of the second region are arranged in this order.

2. The radiographic image capturing apparatus according to claim 1, wherein the plurality of pixels each include a photoelectric conversion element that converts light converted by a scintillator that converts radiation into light into electric charge, and an output circuit section that outputs the electrical signal obtained by amplifying the electric charge.

3. The radiographic image capturing apparatus according to claim 2, wherein the end on the inner side of the readout circuit section is located on the outer side with respect to an end on the outer side of an orthogonal projection of a surface of the scintillator facing the pixels to the pixel array.

4. The radiographic image capturing apparatus according to claim 2, wherein the readout circuit section includes a scanning circuit that converts electrical signals output in parallel from the pixel array into serial electrical signals, and an output section that outputs the serial electrical signals, and wherein the scanning circuit includes a plurality of unit circuit sections.

5. The radiographic image capturing apparatus according to claim 4, wherein one unit circuit section of the plurality of unit circuit sections is disposed between photoelectric conversion elements of two adjacent pixels so that a photoelectric conversion element of one pixel of the two adjacent pixels is interposed between the one unit circuit section and an output circuit section of the one pixel.

6. The radiographic image capturing apparatus according to claim 4, wherein the output section is disposed between photoelectric conversion elements of two adjacent pixels so that a photoelectric conversion element of one pixel of the two adjacent pixels is interposed between the output section and an output circuit section of the one pixel.

7. The radiographic image capturing apparatus according to claim 2, wherein the plurality of pixels and the readout circuit section are disposed across a plurality of semiconductor substrates arranged on a base, and wherein the member is disposed to prevent radiation from entering the readout circuit section disposed across the plurality of semiconductor substrates.

8. The radiographic image capturing apparatus according to claim 7, further comprising:

a housing that houses the base, the plurality of semiconductor substrates, and the member; and a support mechanism that is coupled to the housing and mechanically supports the member.

9. The radiographic image capturing apparatus according to claim 7, further comprising:

a housing that houses the base, the plurality of semiconductor substrates, the scintillator, and the member, wherein the member is fastened to the scintillator.

10. The radiographic image capturing apparatus according to claim 9, wherein the scintillator includes a scintillator layer that converts the radiation into the light, and a support member that supports the scintillator layer, wherein the support member is disposed to face the photoelectric conversion element with the scintillator layer interposed between the support member and the photoelectric conversion element, and wherein the member is fastened to the support member.

11. The radiographic image capturing apparatus according to claim 2, wherein the pixel array further includes, in the second region, a third region in which pixels in which the photoelectric conversion element is shielded from light are arranged to output electrical signals used for correcting the image signals.

12. The radiographic image capturing apparatus according to claim 11, wherein an end on the inner side of the third region is located on the outer side with respect to the end on the inner side of the readout circuit section.

13. A radiographic image capturing system comprising:

the radiographic image capturing apparatus according to claim 1; and a signal processing apparatus that processes an electrical signal from the radiographic image capturing apparatus.

* * * * *